US 9,356,514 B2

(12) United States Patent
Li et al.

(10) Patent No.: US 9,356,514 B2
(45) Date of Patent: May 31, 2016

(54) POWER SUPPLY CONVERSION APPARATUS WITH BOOTSTRAP UNIT

(71) Applicant: Huawei Technologies Co., Ltd., Shenzhen, Guangdong (CN)

(72) Inventors: Ming Li, Shenzhen (CN); Jianping Wang, Chengdu (CN); Caofei Heng, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 210 days.

(21) Appl. No.: 14/324,728

(22) Filed: Jul. 7, 2014

(65) Prior Publication Data

US 2015/0008891 A1 Jan. 8, 2015

(30) Foreign Application Priority Data

Jul. 5, 2013 (CN) .......................... 2013 1 0281877

(51) Int. Cl.
| | |
|---|---|
| *H02M 1/36* | (2007.01) |
| *H02M 3/158* | (2006.01) |
| *H02M 1/08* | (2006.01) |
| *H03K 17/06* | (2006.01) |

(52) U.S. Cl.
CPC ............... *H02M 3/158* (2013.01); *H02M 1/08* (2013.01); *H03K 17/063* (2013.01); *H03K 2217/0081* (2013.01)

(58) Field of Classification Search
CPC ...... H02M 1/36; H02M 3/158; H02M 3/1588
USPC .................... 323/271, 282, 351, 901; 363/49
See application file for complete search history.

(56) References Cited

U.S. PATENT DOCUMENTS

| | | | | |
|---|---|---|---|---|
| 7,026,801 | B2 | 4/2006 | Fowler et al. | |
| 7,046,040 | B2 | 5/2006 | Guedon | |
| 7,710,089 | B2 * | 5/2010 | Kohout ................. | H02M 3/157 323/273 |
| 8,207,720 | B2 * | 6/2012 | Tang ..................... | H02M 3/156 323/271 |
| 2010/0259238 | A1 * | 10/2010 | Cheng ................... | H02M 3/158 323/282 |
| 2012/0049829 | A1 * | 3/2012 | Murakami .............. | H02M 1/32 323/288 |
| 2013/0127371 | A1 * | 5/2013 | Sarig ...................... | H02M 1/36 315/307 |
| 2014/0062449 | A1 * | 3/2014 | Qu .......................... | G05F 3/02 323/311 |
| 2015/0008891 | A1 * | 1/2015 | Li ......................... | H02M 3/158 323/271 |
| 2015/0162830 | A1 * | 6/2015 | Dong .................... | H02M 3/158 323/271 |
| 2015/0214841 | A1 * | 7/2015 | Ramorini ............. | H02M 3/158 323/271 |

FOREIGN PATENT DOCUMENTS

| | | |
|---|---|---|
| CN | 1934772 A | 3/2007 |
| CN | 101247080 A | 8/2008 |
| DE | 4123105 A1 | 1/1993 |

* cited by examiner

*Primary Examiner* — Jeffrey Sterrett
(74) *Attorney, Agent, or Firm* — Leydig, Voit & Mayer, Ltd.

(57) ABSTRACT

Embodiments of the present invention disclose a power supply conversion apparatus, where a control unit generates a corresponding control signal according to a received high level pulse width modulation signal, to control a first PMOS transistor Q3, a second PMOS transistor Q4, and a second NMOS transistor Q2 to be turned off successively, and then to make a first NMOS transistor Q1 conducted, which makes a voltage at a second end of a bootstrap capacitor to rise from ground potential to a PVDD, so that a voltage at a first end of the bootstrap capacitor rises to a PVDD+AVDD as the voltage at the second end rises, and a gate turn-on voltage of the first NMOS transistor Q1 reaches the PVDD+AVDD.

6 Claims, 5 Drawing Sheets

POWER SUPPLY CONVERSION APPARATUS WITH BOOTSTRAP UNIT

CROSS-REFERENCE TO RELATED APPLICATIONS

This application claims priority to Chinese Patent Application No. 201310281877.8, filed on Jul. 5, 2013, which is hereby incorporated by reference in its entirety.

TECHNICAL FIELD

The present invention relates to the field of power supply switch circuit technologies, and in particular, to a power supply conversion apparatus.

BACKGROUND

A mobile terminal product such as a mobile phone, a portable instrument or a notebook computer needs to use a dedicated power supply management and control chip to manage charging and discharging of a battery of the device. In consideration of efficiency, heat dissipation and the like, such a power supply management chip gradually tends to use a switch mode with a higher conversion efficiency, and needs to operate at a high voltage (input by an AC adapter); therefore, a DC-DC switch converter that can operate at a high input power supply voltage generally needs to be integrated in the chip. Design, especially a power output level of such a converter, varies greatly with different processes. For a process supporting a high voltage, a power level of a DC-DC converter may be implemented by using a conventional architecture of High Side PMOS+Low Side NMOS shown in FIG. 1. However, the use of the High Side PMOS architecture places a requirement for a PMOS process. For different application scenarios, a higher withstand voltage of a required component needs a longer channel of the PMOS and greater conductive impedance, which is a great challenge for reducing a chip area and improving system efficiency. Theoretically, compared with a PMOS, an NMOS of a same size has lower conductive impedance. To reduce an area of a power tube, a solution in which the PMOS is replaced with the NMOS may be used, that is, a full NMOS (High Side NMOS+Low Side NMOS) architecture shown in FIG. 2. A key of this architecture is to generate a voltage which can make the High Side NMOS conducted, that is, a PVDD+AVDD voltage in phase2 in FIG. 2 for a currently commonly used LDNMOS component. It is known that the PVDD is already a maximum voltage in a circuit. Therefore, a bootstrap (Bootstrap) circuit needs to be used to implement that a conduction voltage of the High Side NMOS reaches the PVDD+AVDD.

In the prior art, an on-chip or off-chip Schottky (Schottky) diode is generally used to implement the Bootstrap circuit. Moreover, as shown in FIG. 2, in phase1, the AVDD directly charges a capacitor $C_{BST}$ by using the Schottky diode. However, in consideration of a factor such as a forward conduction voltage drop (about 0.3 to 0.7 V) of the Schottky diode, a voltage of a BST node cannot be charged to reach the AVDD; therefore, in phase2, because of the charge continuity of the capacitor, the voltage of the BST node may rise to PVDD+AVDD—forward conduction voltage drop (0.3 to 0.7V), and therefore, it may cause that the High Side NMOS cannot be completely conducted. Therefore, a minimum working voltage further needs to be provided for the circuit to offset the forward conduction voltage drop of the schottky diode. In addition, reverse leakage of the schottky diode is large, which may degrade circuit performance. Moreover, if a BST circuit with an on-chip schottky diode is used, a Schottky process is additionally introduced to a semiconductor manufacturing process, which increases process steps, a production period and cost correspondingly, and limits a range of optional processes as well; and if the off-chip schottky diode is used, an area of a PCB board may be increased, and cost is also increased.

SUMMARY

Embodiments of the present invention provide a power supply conversion apparatus, which has a high-end N-type metal-oxide-semiconductor (NMOS) switch bootstrap circuit, and can solve a problem of implementing a key Bootstrap switch (BST Switch) in a high-voltage Bootstrap circuit in a case where an epitaxial layer (EPI) and an N+bury layer (N+bury layer) do not exist and high voltage resistance of a gate to source (Gate to Source) and a Schottky diode (Schottky Diode) are not supported in a process, thereby improving flexibility of selecting a charging technology development process for a high-voltage switch, and reducing cost and shortening a production period; and for circuit performance, improving overall system efficiency, placing a lower requirement for a minimum voltage of an input power supply, and expanding an application range of a circuit.

According to a first aspect, an embodiment of the present invention provides a power supply conversion apparatus, where the apparatus includes a switch unit, a bootstrap unit, and a control unit.

The switch unit includes a first NMOS transistor Q1 and a second NMOS transistor Q2, where a drain of the first NMOS transistor Q1 is connected to a power supply voltage PVDD of a power level, and a source of the first NMOS transistor Q1 is connected to a drain of the second NMOS transistor Q2 and is output of the power supply conversion apparatus, and a source of the second transistor Q2 is grounded.

The bootstrap unit includes a first PMOS transistor Q3, a second PMOS transistor Q4, and a bootstrap capacitor $C_{bst}$, where a source of the first PMOS transistor Q3 is connected to a power supply voltage AVDD of an analog circuit, a drain of the first PMOS transistor Q3 is connected to a drain of the second PMOS transistor Q4, a first end of the bootstrap capacitor $C_{bst}$ is connected to a source of the second PMOS transistor Q4 for providing a gate turn-on voltage for the first NMOS transistor Q1, and a second end of the bootstrap capacitor $C_{bst}$ is connected to the drain of the first NMOS transistor Q1 and the source of the second NMOS transistor Q2, so that a maximum gate to source voltage VGS of the first NMOS transistor Q1 is equal to a voltage at the two ends of the bootstrap capacitor $C_{bst}$.

In an initial state, the first NMOS transistor Q1 keeps turned off, and the control unit generates a corresponding control signal according to a received low level pulse width modulation PWM signal, to control the second NMOS transistor Q2, the first PMOS transistor Q3, and the second PMOS transistor Q4 to be conducted, so that a voltage at the first end of the bootstrap capacitor $C_{bst}$ is charged to the AVDD, and a voltage at the second end is ground potential.

When the pulse width modulation PWM signal changes to a high level, the control unit generates a corresponding control signal according to a received high level pulse width modulation PWM signal, to control the first PMOS transistor Q3, the second PMOS transistor Q4, and the second NMOS transistor Q2 to be turned off successively, and the first NMOS transistor Q1 is conducted to make the voltage at the second end of the bootstrap capacitor $C_{bst}$ rise from ground potential to the PVDD, so that the voltage at the first end of the bootstrap capacitor $C_{bst}$ rises to a PVDD+AVDD as the voltage at the second end rises, and the gate turn-on voltage of the first NMOS transistor Q1 reaches the PVDD+AVDD, so as to make the first NMOS transistor Q1 completely conducted, which thereby makes an output voltage of the power supply conversion apparatus reach the PVDD, and makes the maximum gate to source voltage of the first NMOS transistor Q1 not larger than the AVDD all the time.

The power supply conversion apparatus provided in the embodiments of the present invention can effectively reduce limitations to a design process in terms of the process, so as to reduce cost, shorten a production period, and improve process selection flexibility; and for circuit performance, can improve overall system efficiency, reduce a minimum requirement for an input power supply voltage, and expand an application range of a circuit.

The technical solutions in the embodiments of the present invention are further described in detail in the following with reference to the accompanying drawings and embodiments.

DESCRIPTION OF EMBODIMENTS

Figure 1:
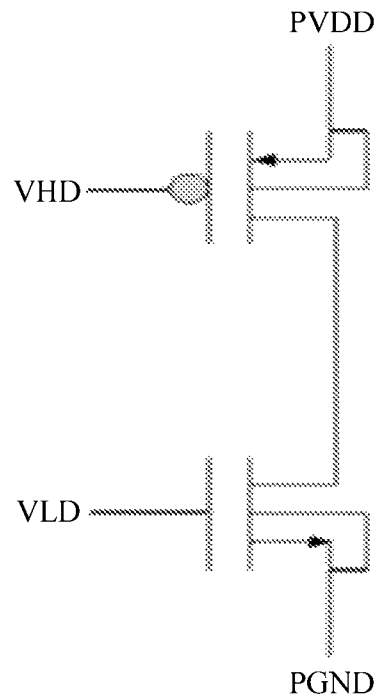
FIG. 1 is a circuit diagram for implementing a power level of a DC-DC converter by using a conventional High Side PMOS+Low Side NMOS architecture provided in the prior art.
Figure 2:
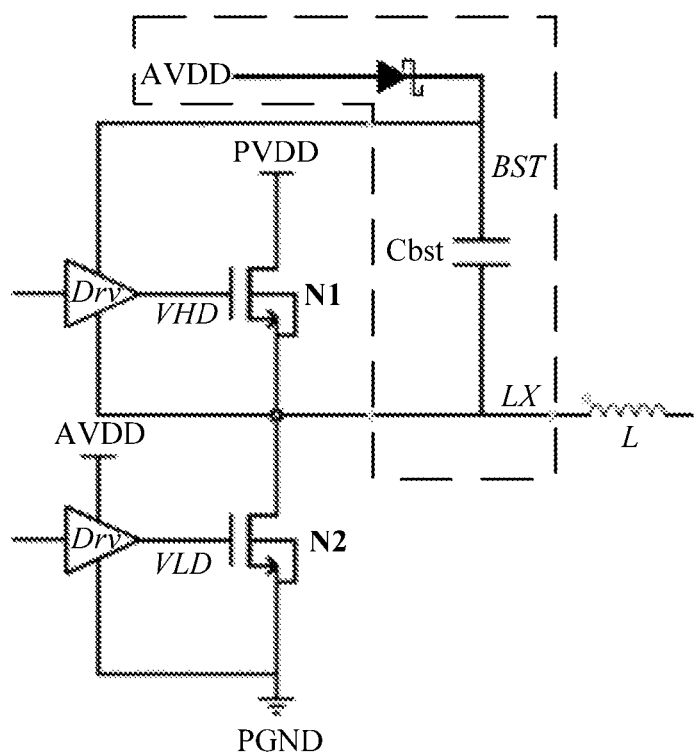
FIG. 2 is a circuit diagram for implementing a power level of a DC-DC converter by using a full-NMOS architecture provided in the prior art.
Figure 3:
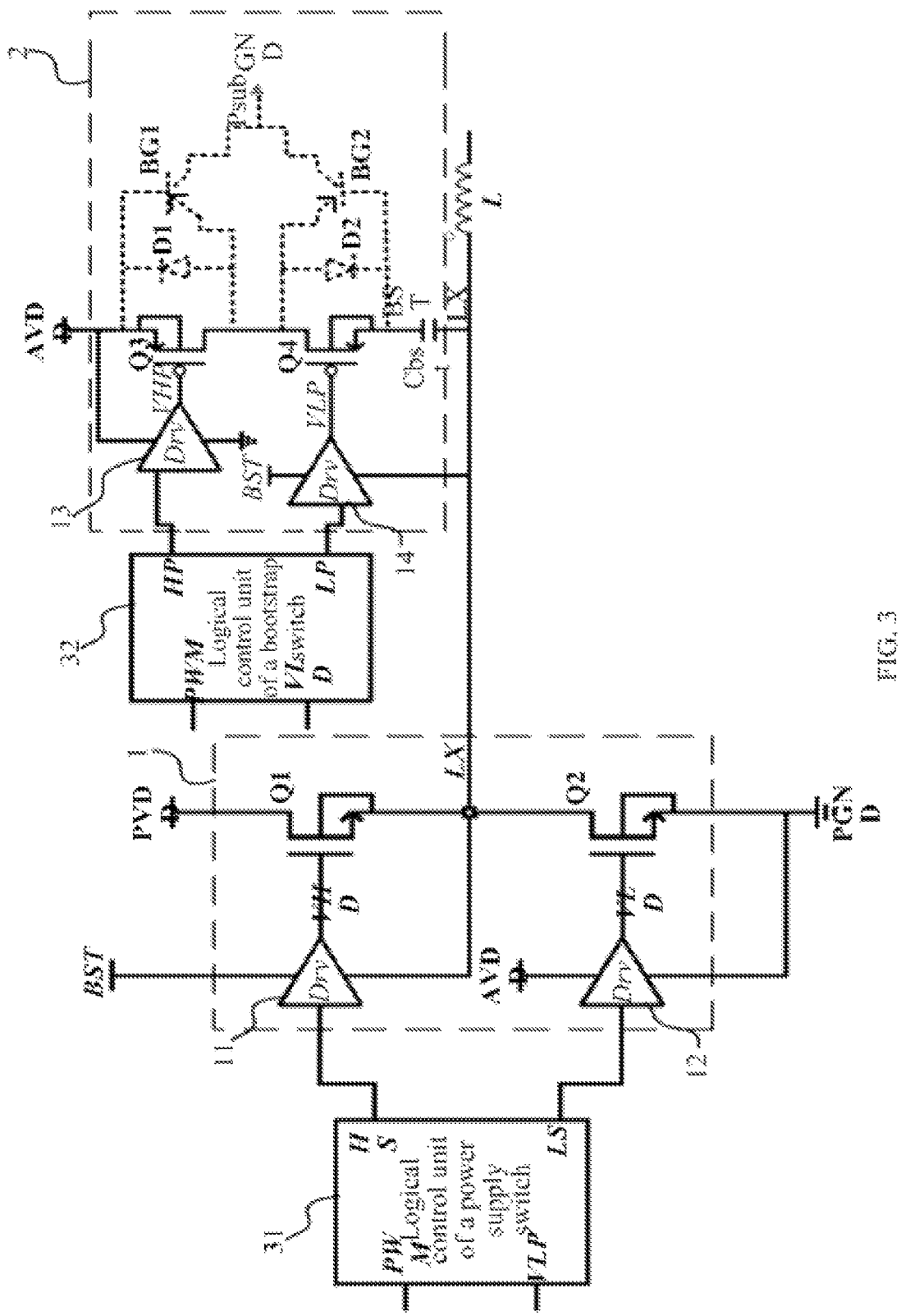
FIG. 3 is a circuit diagram for a power supply conversion apparatus according to an embodiment of the present invention.

FIG. 3 shows a power supply conversion apparatus according to Embodiment 1 of the present invention, which includes a switch unit 1, a bootstrap unit 2, and a control unit 3.

The switch unit 1 includes a first NMOS transistor Q1 and a second NMOS transistor Q2.

The first NMOS transistor Q1 is connected in series with the second NMOS transistor Q2, where a drain of the first NMOS transistor Q1 is connected to a power supply voltage PVDD of a power level, a source of the first NMOS transistor Q1 is connected to a drain of the second NMOS transistor Q2 and is output of the power supply conversion apparatus, and a source of the second transistor Q2 is grounded.

The switch unit 1 further includes a first driving unit 11 and a second driving unit 12.

A signal input end of the first driving unit 11 is connected to an output end of a power switch logic control unit 31 of the control unit 3, a reference power supply end and a reference ground end are connected to two output ends BST and LX of the bootstrap unit 2 respectively, and a signal output end of the first driving unit 11 is connected to a gate of the first NMOS transistor Q1 to provide a gate driving signal for the first NMOS transistor Q1.

A signal input end of the second driving unit 12 is connected to another output end of the power supply switch logic control unit 31 of the control unit 3, a reference power supply end and a reference ground end are connected to a power supply voltage AVDD of an analog circuit and the ground respectively, and a signal output end of the second driving unit 12 is connected to a gate of the second NMOS transistor Q2 to provide a gate driving signal for the second NMOS transistor Q2.

In this embodiment, the first driving unit 11 and the second driving unit 12 output a reference ground voltage when an input signal is at a high level, and output a reference power supply voltage when the input signal is at a low level.

The bootstrap unit 2 includes a first PMOS transistor Q3, a second PMOS transistor Q4, and a bootstrap capacitor $C_{bst}$.

A source of the first PMOS transistor Q3 is connected to the power supply voltage AVDD of the analog circuit, a drain of the first PMOS transistor Q3 is connected to a drain of the second PMOS transistor Q4, a first end (a BST end) of the bootstrap capacitor $C_{bst}$ is connected to a source of the second PMOS transistor Q4, and is connected to a reference power supply end of the first driving unit 11 for providing the first NMOS transistor Q1 with a voltage of a BST node as a gate turn-on voltage of the first NMOS transistor Q1 for when the first driving unit receives a low level input signal.

A second end (an LX end) of the bootstrap capacitor $C_{bst}$ is connected to the drain of the first NMOS transistor Q1 and the source of the second NMOS transistor Q2, so that a maximum gate to source voltage VGS of the first NMOS transistor Q1 is equal to a voltage at the two ends of the bootstrap capacitor $C_{bst}$, that is, $V_{GS}=V_{BST}-V_{LX}$.

The bootstrap unit 2 further includes a third driving unit 13 and a fourth driving unit 14.

A signal input end of the third driving unit 13 is connected to an output end of a bootstrap switch logic control unit 32 of the control unit 3, a reference power supply end and a reference ground end are connected to the power supply voltage AVDD of the analog circuit and the ground respectively, and a signal output end of the third driving unit 13 is connected to a gate of the first PMOS transistor Q3 to provide a gate driving signal for the first PMOS transistor Q3.

A signal input end of the fourth driving unit 14 is connected to another output end of the bootstrap switch logic control unit 32 of the control unit 3, a reference power supply end and a reference ground end are connected to two output ends BST and LX of the bootstrap unit 2 respectively, and a signal output end of the fourth driving unit 14 is connected to a gate of the second PMOS transistor Q4 to provide a gate driving signal for the second PMOS transistor Q4.

In this embodiment, the third driving unit 13 and the fourth driving unit 14 output a reference ground voltage when the input signal is at a high level, and output a reference power supply voltage when the input signal is at a low level.

An output end of the power supply conversion apparatus further includes an inductive load, which is used to suppress a peak generated when a circuit is turned off.

In an initial state, the first NMOS transistor Q1 keeps turned off, the control unit 3 generates a corresponding control signal according to a received low level pulse width modulation PWM signal, to control the second driving unit 12 to output a high level, so as to make the second NMOS transistor Q2 conducted, so that a voltage of an LX node is connected to ground potential; and the control unit 3 further generates a corresponding control signal, to control both the third driving unit 13 and the fourth driving unit 14 to output a low level, so as to make the first PMOS transistor Q3 and the second PMOS transistor Q4 conducted, so that the bootstrap capacitor $C_{bst}$ is charged. Because conduction voltage drops of the first PMOS transistor Q3 and the second PMOS transistor Q4 are $I_{charge} \times (Ron\_Q3+Ron\_Q4)$, where $I_{charge}$ is a charging current, in a unit of mA, Ron_Q3 and Ron_Q4 are on resistance of the first PMOS transistor Q3 and the second PMOS transistor Q4 respectively, in a unit of ohm; therefore, the conduction voltage drops of the first PMOS transistor Q3 and the second PMOS transistor Q4 are small, which are at an order of magnitude of $10^{-2}$ or $10^{-3}$; therefore, when the charging is complete, a voltage of the bootstrap capacitor $C_{bst}$ at the BST node may be considered to be infinitely close to the AVDD. In addition, because $I_{charge}=(AVDD-V_{bst})/(Ron\_Q3+Ron\_Q4)$, a charging current for charging the bootstrap capacitor $C_{bst}$ is controlled by designing the on resistance Ron_Q3 and Ron_Q4.

When the pulse width modulation PWM signal changes from a low level to a high level, the control unit 3 generates a corresponding control signal according to a received high level pulse width modulation PWM signal, to control the third driving unit 13 and the fourth driving unit 14 to separately transmit the reference power supply voltage to turn off the first PMOS transistor Q3 and the second PMOS transistor Q4. In addition, the control signal controls the second driving unit 12 to transmit the reference ground voltage, and controls the first driving unit 11 to transmit the reference power supply voltage, so as to make the second NMOS transistor Q2 turned off and the first NMOS transistor Q1 conducted. Therefore, the PVDD charges the LX end of the bootstrap capacitor $C_{bst}$ by using the conducted first NMOS transistor Q1, so as to make a voltage of the bootstrap capacitor $C_{bst}$ at the LX end rise from the ground potential to the PVDD. Similarly, a conduction voltage drop of the first NMOS transistor Q1 is also small, and therefore, when the charging is complete, the voltage of the LX node may be considered to be infinitely close to the PVDD. During a process in which the voltage of the LX node rises, a voltage of the bootstrap capacitor $C_{bst}$ at the BST end synchronously rises because of the charge continuity principle of the capacitor. When the charging is complete, the voltage of the BST node rises to be infinitely close to the PVDD+AVDD.

Therefore, the gate turn-on voltage of the first NMOS transistor Q1 is infinitely close to the PVDD+AVDD, making the first NMOS transistor Q1 completely conducted, so that the output voltage of the power supply conversion apparatus is infinitely close to the PVDD.

In addition, the gate to source voltage VGS of the first NMOS transistor Q1 is equal to the voltage at the two ends of the bootstrap capacitor $C_{bst}$ all the time in the conduction process of the first NMOS transistor Q1, that is, $VGS=V_{Cbst}$. After the pulse width modulation PWM signal changes from a low level to a high level, the voltage at the two ends of the bootstrap capacitor $C_{bst}$ is equal to the AVDD during and after the charging process; therefore, when the first NMOS transistor Q1 is completely conducted, the gate to source voltage VGS of the first NMOS transistor Q1 may be not larger than the AVDD, which can effectively avoid that a withstand voltage at a gate end of the first NMOS transistor Q1 is not larger than a maximum withstand voltage when the first NMOS transistor Q1 is completely conducted.

When the pulse width modulation PWM signal changes to a low level, the control unit generates a corresponding control signal according to the received low level pulse width modulation PWM signal, to control the third driving unit 13 and the fourth driving unit 14 to separately transmit the reference ground voltage to drive the first PMOS transistor Q3 and the second PMOS transistor Q4 to be conducted. In addition, the control signal controls the first driving unit to transmit the reference ground voltage, and controls the second driving unit 12 to transmit the reference power supply voltage, making the first NMOS transistor Q1 turned off and the second NMOS transistor Q2 conducted. Therefore, the output voltage of the power supply conversion apparatus is 0, implementing output turn-off of the power supply conversion apparatus.

Figure 4:
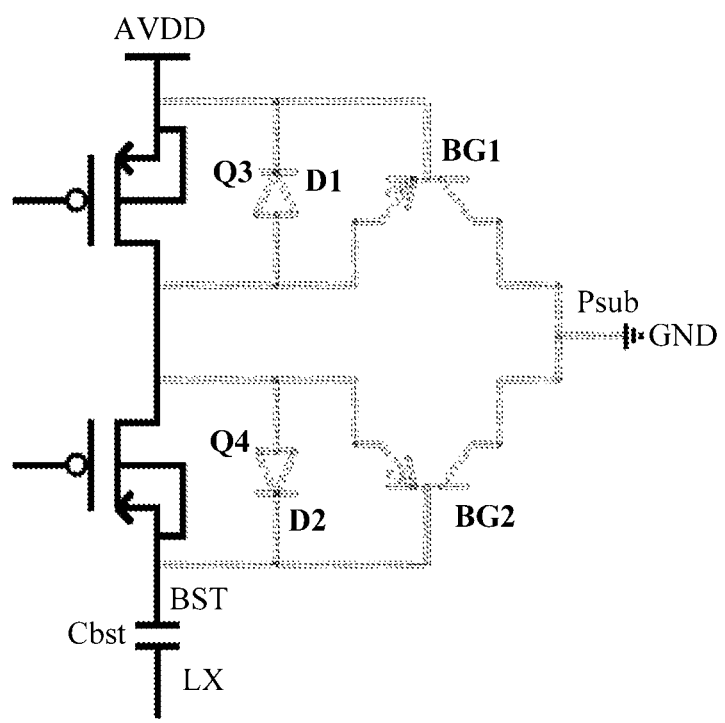
FIG. 4 is a diagram of a parasitic circuit for a bootstrap circuit according to an embodiment of the present invention.
Figure 5:
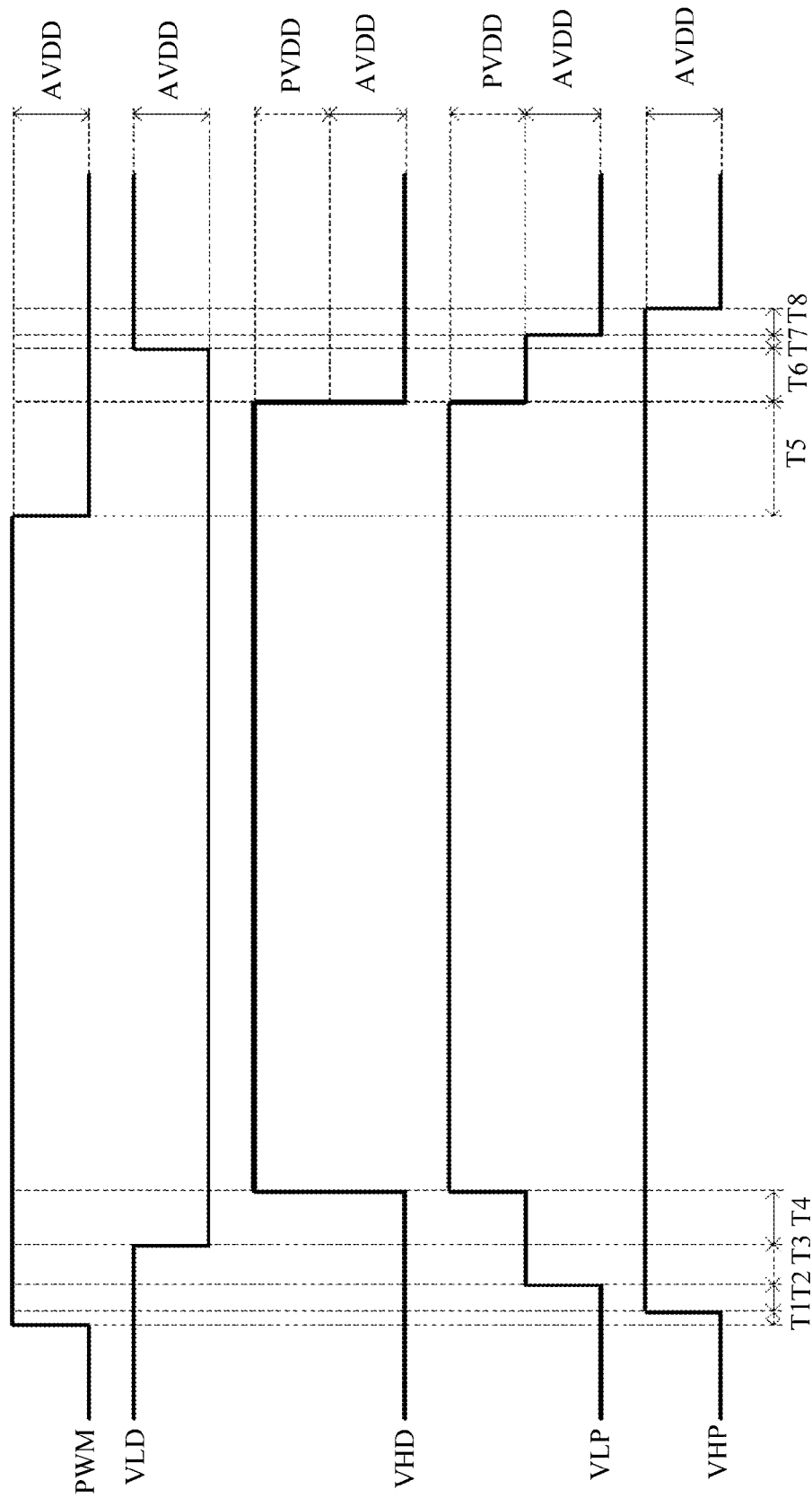
FIG. 5 is a sequence diagram of a power supply conversion apparatus according to an embodiment of the present invention.

A parasitic circuit exists in a back-to-back PMOS architecture in the bootstrap unit 2, as shown in FIG. 4. To avoid conduction of parasitic diodes D1 and D2 and parasitic PNP triodes BG1 and BG2 in the conduction process of the first PMOS transistor Q3 and the second PMOS transistor Q4, a BCD process with an epitaxial layer and an N+bury layer may be generally used as a solution. However, for a BCD process which does not support the epitaxial layer and the N+bury layer, in the present invention, the logic control unit 3 is used to constrain a sequence of gate end control logic of transistors in a circuit, so as to avoid the problem of electric leakage during conduction of the parasitic circuit. A specific sequence requirement for logic control is shown in FIG. 5, in which it is assumed that a ground voltage PGND=0.

After a first time T1 since the pulse width modulation PWM signal changes from a low level to a high level, the power switch logic control unit 31 generates a first control signal to control the third driving unit 13 to transmit the reference power supply voltage AVDD to the gate of the first PMOS transistor Q3, making VHP=AVDD, so as to turn off the first PMOS transistor Q3; then generates, after a delay of a second time T2, a second control signal to control the fourth driving unit 14 to transmit the reference power supply voltage $V_{bst}$ ($Vb_{st}$=AVDD at this time) to the gate of the second PMOS transistor Q4, making VLP=AVDD, so as to turn off the second PMOS transistor Q4; then generates, after a delay of a third time T3, a third control signal to control the second driving unit 12 to transmit the reference ground voltage to the gate of the second NMOS transistor Q2, making VLD=0, so as to turn off the second NMOS transistor Q2 and disconnect the LX node from the ground; and then generates, after a delay of a fourth time T4, a fourth control signal to control the first driving unit 11 to transmit the reference power supply voltage $V_{bst}$ ($V_{bst}$=AVDD at this time) to the gate of the first NMOS transistor Q1, making VHD=AVDD, so as to make the first NMOS transistor Q1 conducted, thereby implementing that potential of the LX node rapidly rises to the PVDD, that is, the output voltage of the power supply conversion apparatus. In this case, gate potential VHD of the first PMOS transistor Q3 also rapidly rises to the AVDD+PVDD. The T1, T2, T3, and T4 are at an nS level. The T1 is a signal transmission delay of the power witch logic control unit 31 and the third driving unit 13; the T2 is not less than a time in which the first PMOS transistor Q3 is completely turned off after the gate of the first PMOS transistor Q3 is connected to the reference power supply voltage AVDD; the T3 is not less than a time in which the second PMOS transistor Q4 is completely turned off after the gate of the second PMOS transistor Q4 is connected to the reference power supply voltage $V_{bst}$; and the T4 is not less than a time in which the second NMOS transistor Q2 is completely turned off after the gate of the second NMOS transistor is connected to the reference ground voltage, so that a voltage of a drain connected to both the first PMOS transistor Q3 and the second PMOS transistor Q4 is always smaller than the voltage of the source of the first PMOS transistor Q3 and the voltage of the source of the second PMOS transistor Q4 in the foregoing process, the parasitic diodes D1 and D2 are always reverse-biased, Ve−Vb<0 for the parasitic triodes BG1 and BG2, so as to avoid the conduction of the parasitic diodes D1 and D2 and the parasitic triodes BG1 and BG2 of the first PMOS transistor Q3 and the second PMOS transistor Q4 in a bootstrap and pressure boosting process, which ensures efficiency of the power supply conversion apparatus.

The bootstrap switch logic control unit 32 generates, after a fifth time T5 when the pulse width modulation PWM signal changes from a high level to a low level, a fifth control signal to control the first driving unit 11 to transmit the reference ground voltage $V_{LZ}$ ($V_{LX}$=PVDD at this time) to the gate of the first NMOS transistor Q1, making VHD=PVDD, so that a gate to source voltage of the first NMOS transistor is 0, and the Q1 is turned off; after the first NMOS transistor Q1 is turned off, the voltage $V_{L4}$ rapidly decreases to 0, that is, a gate voltage VHD of the first NMOS transistor Q1 also rapidly decreases to 0; in this case, the voltage of the bootstrap capacitor $C_{bst}$ at the BST end also decreases to the AVDD, so that a gate voltage VHP of the first PMOS transistor Q3 changes to the AVDD; and then the bootstrap switch logic control unit 32 generates, after a delay of sixth time T6, a sixth control signal to control the second driving unit 12 to transmit the reference power supply voltage AVDD to the second NMOS transistor Q2, making VLD=AVDD, so as to make the second NMOS transistor Q2 conducted, so that the output voltage of the power supply conversion apparatus is constantly 0.

After a delay of a seventh time T7, a seventh control signal is generated to control the third driving unit 13 to transmit the reference ground voltage to the gate of the first PMOS transistor Q3, making VHP=0, so that the first PMOS transistor Q3 is conducted; and then after a delay of an eighth time T8, an eighth control signal is generated to control the fourth driving unit 14 to transmit the reference ground voltage $V_{LX}$ ($V_{LX}$=0) to the gate of the second PMOS transistor Q4, making VLP=0, so as to make the second PMOS transistor Q4 conducted, which implements charging of the bootstrap capacitor $C_{bst}$. When the charging is complete, the voltage of the bootstrap capacitor $C_{bst}$ at the BST node is infinitely close to the AVDD. In addition, in this process, it is ensured that the parasitic diodes D1 and D2 and the parasitic triodes BG1 and BG2 are turned off all the time, which avoids reverse leakage of the transistor. The T5, T6, T7, and T8 are at the nS level. The T5 is a signal transmission delay of the control unit and the first driving unit; the T6 is not less than a time in which the first NMOS transistor Q1 is completely turned off; the T7 is not less than a time of complete conduction of the second NMOS transistor Q2; and the T8 is not less than a time in which the first PMOS transistor Q3 is completely turned off.

Figure 6:
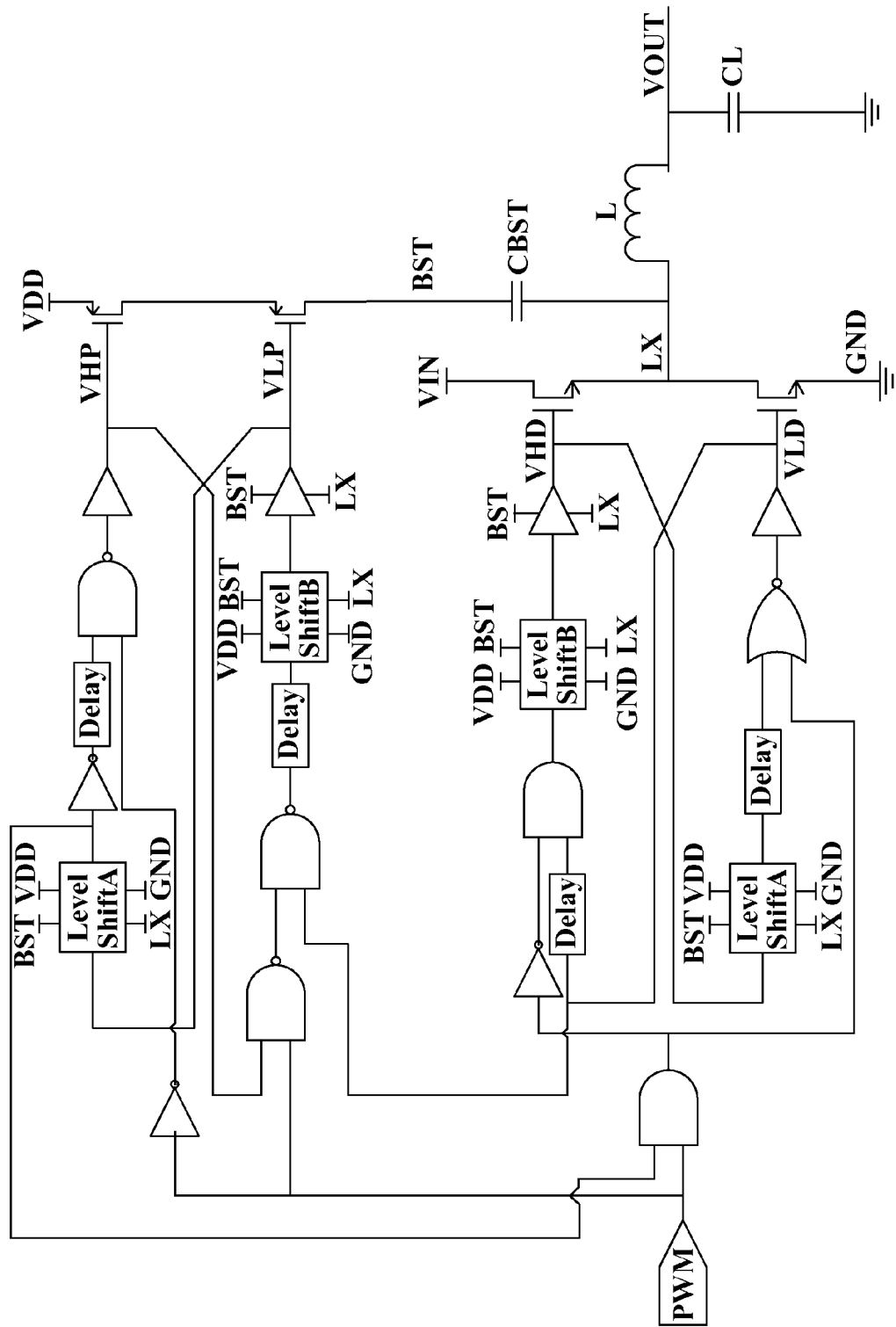
FIG. 6 is a logic reference diagram of a power supply conversion apparatus according to an embodiment of the present invention.

The foregoing sequence constraint may be specifically implemented by using a logical circuit shown in FIG. 6. In the figure, VDD indicates a low voltage power supply, VIN indicates a high voltage power supply; a Level shiftA unit is configured to convert signals in voltage domains from BST to LX to signals in voltage domains from the VDD to GND; and a Level ShiftB unit is configured to convert signals in the voltage domains from the VDD to the GND to signals in the voltage domains from the BST to the LX. Definitely, a specific manner of implementing a circuit with the sequence constraint may further be in other forms, and examples are not given herein again.

In addition, to avoid the parasitic triode BG2 from possibly being triggered to be conducted, a size ratio between the first PMOS transistor Q3 and the second PMOS transistor Q4 may be set, so as to further ensure that neither of the parasitic triodes BG1 and BG2 is conducted when the power supply conversion apparatus is operating. The size ratio between the first PMOS transistor Q3 and the second PMOS transistor Q4 meets:

$$(W/L)_{Q4} > \{[(AVDD - V_{BST\_min})/V_{diode\_min}] - 1\}(W/L)_{Q3}.$$

Where, L is a transistor gate length, W is a transistor gate width, $V_{BST\_min}$ is a minimum voltage before the first PMOS transistor Q3 and the second PMOS transistor Q4 are conducted, and $V_{diode\_min}$ is a minimum conduction voltage of the parasitic diode D2 of the second PMOS transistor Q4.

When $[(AVDD - V_{BST\_min})V_{diode\_min}]$ is greater than 1, the principle is as follows: when both the Q3 and the Q4 are turned on to charge the $C_{bst}$, a voltage difference between the Q3 and Q4 is $(AVDD - V_{BST\_min})$, divided voltages of drain-source voltages of the Q3 and Q4 are related to width/length ratios (W/L) of the gates of the Q3 and Q4; when the drain-source voltage of the Q4 is greater than the minimum conduction voltage $V_{diode\_min}$ of the parasitic diode D2 (that is, a BE junction of the BG2), a path from the AVDD through the Q3 and BG2 to the ground exists, causing waste of a power supply current and loss of power supply efficiency. Therefore, it must be ensured that the drain-source voltage of the Q4 is smaller than the minimum conduction voltage $V_{diode\_min}$ of the parasitic diode D2 (that is, the BE junction of the BG2). According to the following calculation:

$$[Ron4*(AVDD - V_{BST\_min})/(Ron3 + Ron4)] < V_{diode\_min},$$

where

Ron3 is conductive impedance of the Q3, which is inversely proportional to $(W/L)_{Q3}$; and Ron4 is conductive impedance of the Q4, which is inversely proportional to $(W/L)_{Q4}$;

It is obtained that: $\{[(AVDD - V_{BST\_min})/V_{diode\_min}] - 1\} <$ (Ron3/Ron4); and Ron3/Ron4 = $(W/L)_{Q4}/(W/L)_{Q3}$; as a result:

$$(W/L)_{Q4}/(W/L)_{Q3} > \{[(AVDD - V_{BST\_min})/V_{diode\_min}] - 1\};$$

that is, $$(W/L)_{Q4} > \{[(AVDD - V_{BST\_min})/V_{diode\_min}] - 1\}(W/L)_{Q3}.$$

The power supply conversion apparatus provided in the embodiments of the present invention can solve the problem of implementing a key bootstrap switch (BST Switch) in a high-voltage bootstrap circuit in a case where an epitaxial layer, an N+bury layer, high voltage resistance of a gate to source, and a Schottky diode are supported in a process, thereby improving flexibility of selecting a charging technology development process for a high-voltage switch, and effectively reducing cost and shortening a production period; and for circuit performance, effectively avoiding parasitic leakage, and improving overall system efficiency. Moreover, compared with a solution to implementing the bootstrap circuit by using the Schottky diode, a conduction voltage drop of the bootstrap circuit is close to 0, thereby placing a lower requirement for a minimum input power supply, and expanding an application range of a circuit.

A person skilled in the art may be further aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the embodiments of the present invention.

In combination with the embodiments disclosed in this specification, methods or algorithm steps may be implemented by hardware, a software module executed by a processor, or a combination thereof. The software module may be placed in a random access memory (RAM), a memory, a read-only memory (ROM), an electrically programmable ROM, an electrically erasable programmable ROM, a register, a hard disk, a removable disk, a CD-ROM, or a storage medium of any other form well-known in the art.

The objectives, technical solutions, and beneficial effects of the embodiments of the present invention have been further described in detail through the above specific embodiments. It should be understood that the above descriptions are merely specific embodiments of the present invention, but are not intended to limit the protection scope of the embodiments of the present invention. Any modification, equivalent replacement, or improvement made without departing from the spirit and principle of the embodiments of the present invention shall fall within the protection scope of the embodiments of the present invention.

What is claimed is:

1. A power supply conversion apparatus, wherein the apparatus comprises: a switch unit, a bootstrap unit, and a control unit, wherein the switch unit comprises a first N-type metal-oxide-semiconductor (NMOS) transistor and a second NMOS transistor, wherein a drain of the first NMOS transistor is connected to a power supply voltage PVDD of a power level, a source of the first NMOS transistor is connected to a drain of the second NMOS transistor and is an output of the power supply conversion apparatus, and a source of the second transistor is grounded;

the bootstrap unit comprises a first P-type metal-oxide-semiconductor PMOS transistor, a second PMOS transistor, and a bootstrap capacitor, wherein a source of the first PMOS transistor is connected to a power supply voltage AVDD of an analog circuit, a drain of the first PMOS transistor is connected to a drain of the second PMOS transistor, a first end of the bootstrap capacitor is connected to a source of the second PMOS transistor for providing a gate turn-on voltage for the first NMOS transistor, and a second end of the bootstrap capacitor is connected to the drain of the first NMOS transistor and the source of the second NMOS transistor, so that a maximum gate to source voltage VGS of the first NMOS transistor is equal to a voltage at the two ends of the bootstrap capacitor; and in an initial state, the first NMOS transistor remains turned off, and the control unit generates a corresponding control signal according to a received low level pulse width modulation PWM signal, to control the second NMOS transistor, the first PMOS transistor, and the second PMOS transistor to be conductive, so that a voltage at the first end of the bootstrap capacitor is charged to the AVDD, and a voltage at the second end is ground potential; and when the PWM signal changes to a high level, the control unit generates a corresponding control signal according to a received high level PWM signal, to control the first PMOS transistor, the second PMOS transistor, and the second NMOS transistor to be turned off successively, and to control the first NMOS transistor to be conductive, making the voltage at the second end of the bootstrap capacitor rise from the ground potential to the PVDD voltage, so that the voltage at the first end of the bootstrap capacitor rises to a PVDD+AVDD voltage as the voltage at the second end rises, and the gate turn-on voltage of the first NMOS transistor reaches the PVDD+AVDD voltage, so as to make the first NMOS transistor completely conducted, which thereby makes an output voltage of the power supply conversion apparatus reach the PVDD voltage, and makes the maximum gate to source voltage of the first NMOS transistor not larger than the AVDD voltage all the time.

2. The apparatus according to claim 1, wherein that the control unit generates a corresponding control signal to control the first PMOS transistor, the second PMOS transistor, and the second NMOS transistor to be turned off successively, and to control the first NMOS transistor to be conducted includes:

generating, by the control unit after a first time T1 since the pulse width modulation PWM signal changes from a low level to a high level, a first control signal to make the first PMOS transistor turn off; generating, after a delay of a second time T2, a second control signal to make the second PMOS transistor turn off; generating, after a delay of a third time T3, a third control signal to make the second NMOS transistor turn off; and then generating, after a delay of a fourth time T4, a fourth control signal to make the first NMOS transistor conduct, so that conduction of parasitic diodes and parasitic triodes of the first PMOS transistor and the second PMOS transistor is avoided in a bootstrap and pressure boosting process;

wherein, the T1 is a signal transmission delay of the control unit and a third driving unit; the T2 is not less than a time in which the first PMOS transistor is completely turned off after being conductive; the T3 is not less than a time in which the second PMOS transistor is completely turned off after being conductive; and the T4 is not less than a time in which the second NMOS transistor is completely turned off after being conductive.

3. The apparatus according to claim 2, wherein the control unit comprises a power supply switch logic control unit and a bootstrap switch logic control unit; the switch unit further comprises the first driving unit and a second driving unit; and the bootstrap unit further comprises the third driving unit and a fourth driving unit; and a control signal output end of the power supply switch logic control unit is connected to signal input ends of both the first driving unit and the second driving unit, and a control signal output end of the bootstrap switch logic control unit is connected to signal input ends of both the third driving unit and the fourth driving unit, so that the first, second, third and fourth driving units separately output driving signals to gates of the first NMOS transistor, the second NMOS transistor, the first PMOS transistor, and the second PMOS transistor according to the received control signal, so as to make the first NMOS transistor, the second NMOS transistor, the first PMOS transistor, and the second PMOS transistor conductive or turn off.

4. The apparatus according to claim 1, wherein when the PWM signal received by the control unit changes from a high level to a low level, the control unit generates, a fifth control signal to make the first NMOS transistor turn off, generates, after a delay of a sixth time T6, a sixth control signal to make the second NMOS transistor conductive, generates, after a delay of a seventh time T7, a seventh control signal to make the first PMOS transistor conductive, and then generates, after a delay of an eighth time T8, an eighth control signal to make the second PMOS transistor conductive, so that the output voltage of the power supply conversion apparatus is 0;

wherein, the T5 is a signal transmission delay of the control unit and a first driving unit; the T6 is not less than a time in which the first NMOS transistor is completely turned off after being conductive; the T7 is not less than a time in which the second NMOS transistor is completely turned off after being conductive; and the T8 is not less than a time in which the first PMOS transistor is completely turned off after being conductive.

5. The apparatus according to claim 1, wherein a size ratio between the first PMOS transistor and the second PMOS transistor satisfies:

$$(W/L)_{Q4} > \{[(AVDD - V_{BST\_min})/V_{diode\_min}] - 1\}(W/L)_{Q3},$$

wherein, L is a transistor gate length, W is a transistor gate width, $V_{BST\_min}$ is a minimum voltage of the BST end of the $C_{bst}$ capacitor before the first PMOS transistor (Q3) and the second PMOS transistor (Q4) are conducted, and $V_{diode\_min}$ is a minimum conduction voltage of parasitic diodes of the first PMOS transistor and the second PMOS transistor.

6. The apparatus according to claim 1, wherein an output end of the power supply conversion apparatus further comprises an inductive load.

* * * * *